United States Patent [19]

Ferut et al.

[11] Patent Number: 5,432,449
[45] Date of Patent: Jul. 11, 1995

[54] TEST APPARATUS FOR MAGNETIC RESONANCE IMAGING SYSTEMS

[75] Inventors: John E. Ferut, Delafield; Kenneth W. Belt, Fort Atkinson; Phillip E. Steen, Delafield; Johnny E. Parham, III, Milwaukee; John A. Wolak, Waukesha; Howard R. Wagner, Milwaukee, all of Wis.

[73] Assignee: General Electric Company, Milwaukee, Wis.

[21] Appl. No.: 23,259

[22] Filed: Feb. 25, 1993

[51] Int. Cl.⁶ .................................. G01R 33/20
[52] U.S. Cl. ................................. 324/318
[58] Field of Search .............. 324/318, 300, 314; 128/653.2, 653.5

[56] References Cited

U.S. PATENT DOCUMENTS

| | | | |
|---|---|---|---|
| 4,642,569 | 2/1987 | Hayes et al. | 324/318 |
| 4,725,781 | 2/1988 | Roschmann | 324/318 |
| 4,733,190 | 3/1988 | Dembinski | 324/318 |
| 4,819,515 | 11/1989 | Roemer | 324/318 |
| 4,820,985 | 4/1989 | Eash | 324/318 |
| 4,833,409 | 5/1989 | Eash | 324/318 |
| 4,888,555 | 12/1989 | Vaughan et al. | 324/318 |
| 5,053,711 | 10/1991 | Hayes et al. | 324/318 |
| 5,081,418 | 1/1992 | Hayes et al. | 324/318 |
| 5,165,050 | 11/1992 | Goodenough et al. | 324/318 |
| 5,242,455 | 9/1993 | Skeens et al. | 128/653.2 |

FOREIGN PATENT DOCUMENTS 0157547  9/1984  Japan ............... 128/653.2

OTHER PUBLICATIONS

Pages 14-5 and 14-41 of General Electric MRI troubleshooting, Manual. (Feb. 24, 1993).

Primary Examiner—Sandra L. O'Shea
Assistant Examiner—Raymond Y. Mah
Attorney, Agent, or Firm—Quarles & Brady

[57] ABSTRACT

A fixture for testing a magnetic resonance imaging system comprises a mounting plate for positioning the fixture within the system. The mounting plate has a plurality of apertures each of which being adapted to receive a test coil. The test coil includes a housing having a section that can fit within each mounting plate aperture and a receptor for holding a test substance. A coil with a plurality of turns of a conductor is located with the housing and an electrically conductive shield extends around the coil. One or more nestable spacer modules are provided to fit with a mounting plate aperture and receive the test coil to maintain the test coil a defined distance from the mounting plate.

10 Claims, 4 Drawing Sheets

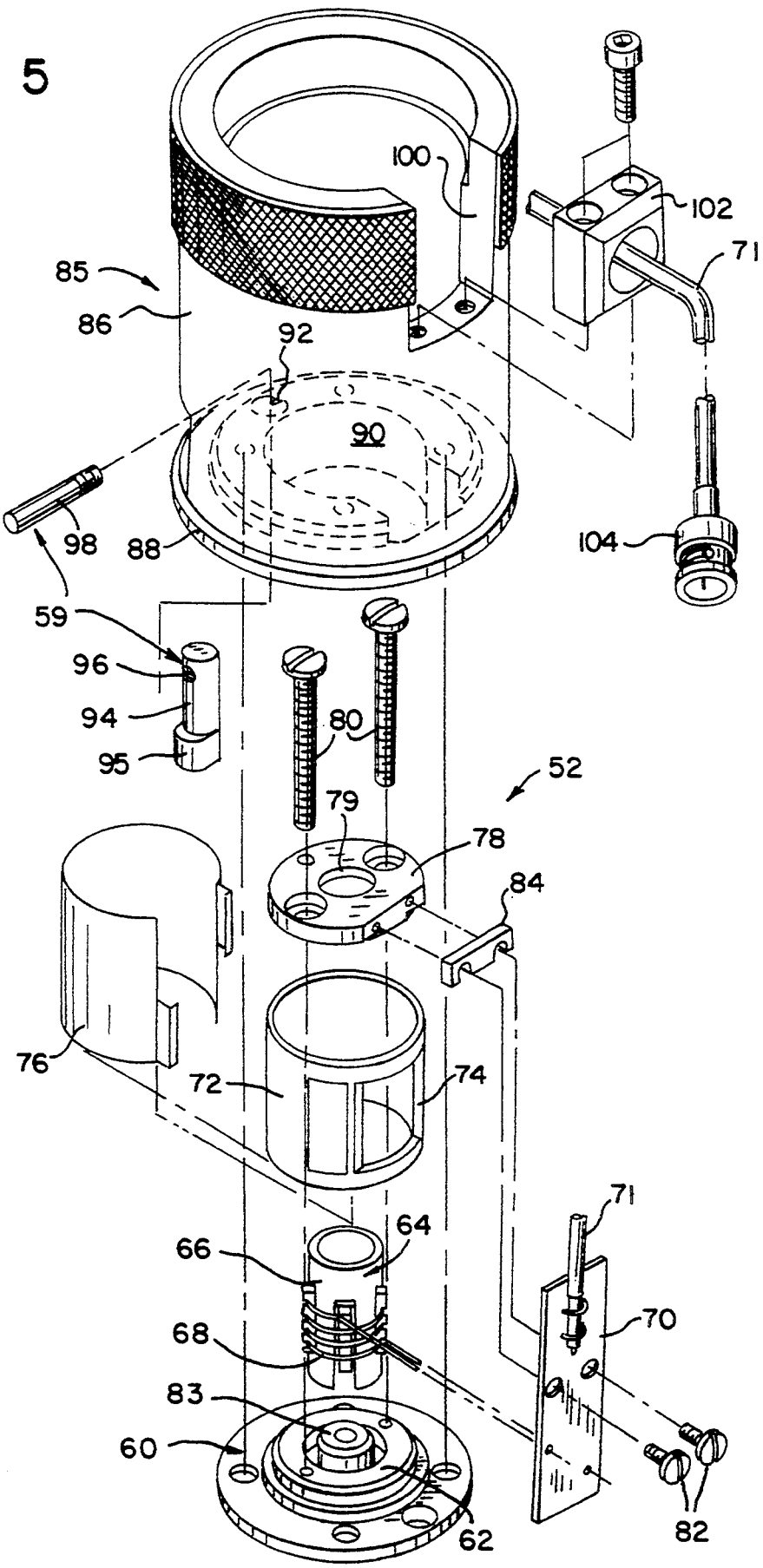

TEST APPARATUS FOR MAGNETIC RESONANCE IMAGING SYSTEMS

BACKGROUND OF THE INVENTION

The present invention relates to magnetic resonance imaging systems; and more particularly to equipment for detecting errors, measuring performance and calibrating such systems.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$, of the nucleus). Nuclei which exhibit this phenomena are referred to herein as "spins".

When a substance, such as human tissue, is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a radio frequency field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. To perform such a scan, it is necessary to elicit NMR signals from specific locations in the subject. This is accomplished by employing magnetic fields (Gx, Gy, and Gz) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The received NMR signals are digitized and processed to reconstruct the image using one of many well known reconstruction techniques.

The NMR system has to accurately generate the various magnetic fields in order to create an image of the region of interest. One technique for detecting inaccuracies in the generated fields and in the detection of NMR signals involves placing a test sample of a known material at a defined location within the NMR system. After exciting the test sample, NMR signals therefrom are detected and analyzed to determine if the received signals conform with the predicted response from the test sample. Any deviation from the predicted response provides information that is useful in determining the error in the system that caused the deviation and the compensation measures to be taken.

Previous test samples were excited by a small RF coil placed immediately around the sample. In order to minimize the test RF coil being affected by signals from other coils within the magnet assembly, a resistor was connected in series with the test coil to reduce the quality factor Q of the coil. Even so, the test coil response was very sensitive to the position within fields generated by the NMR system. While this approach worked well in previous systems, it lowered the signal to noise ratio of the test coil signal and decreased the test coil's overall sensitivity to NMR signals.

Certain NMR systems have a plurality of input channels for processing NMR signals. With prior test coils, separate test procedures had to be run for each channel as the poor signal to noise ratio and sensitivity of the test coil permitted the test coil to be connected to only one channel at a time.

SUMMARY OF THE INVENTION

A magnetic resonance imaging system has an electromagnet coil assembly for exciting nuclei of an object placed within the assembly. The coil assembly generates magnetic field gradients along three orthogonal axes having an isocenter at which the magnitudes of the magnetic field gradients are zero.

A test fixture for the magnetic resonance imaging system comprises a mounting plate which during a test procedure is positioned at a reference location within the electromagnet coil assembly. A test coil unit includes a housing with a portion adapted to fit within any one of the apertures in the mounting plate and also includes a receptor for a test substance. Commonly the test substance is contained within a vial that is placed into an aperture in the receptor.

A coil, formed by a plurality of turns of an electrical conductor wound around a coil form, is located within the housing. An electrically conductive shield extends substantially around the coil within the housing. Preferably the shield consists of a cylindrical form which a conductive material applied to the surface of the form.

In the preferred embodiment of the present invention, stackable spacer modules also are provided to enable the test coil assembly to be located at different distances above the mounting plate. Each spacer module has an opening for receiving part of either the test coil housing or another spacer module. Each spacer module also has a portion that fits within any one of the apertures in the mounting plate, as well as within the opening of another spacer module or test coil housing. The spacer modules and the test coil housing are provided with locking mechanisms to hold them in place once assembled onto the mounting plate.

A purpose of the present invention is to provide a fixture which is used to generate signals for troubleshooting and calibrating a magnetic resonance imaging system.

Another object is to provide the fixture which a test coil that has a high quality factor to be able to produce a strong NMR signal from a test substance placed within the system during a test procedure.

A further object of the present invention is to provide the test coil with a mechanism that inhibits interaction of the test coil with other coils and components of the magnetic resonance imaging system.

BRIEF DESCRIPTION OF THE DRAWINGS

FIG. 5 is an exploded view of a test coil assembly of the test apparatus; and

DETAILED DESCRIPTION OF THE INVENTION

Figure 1:
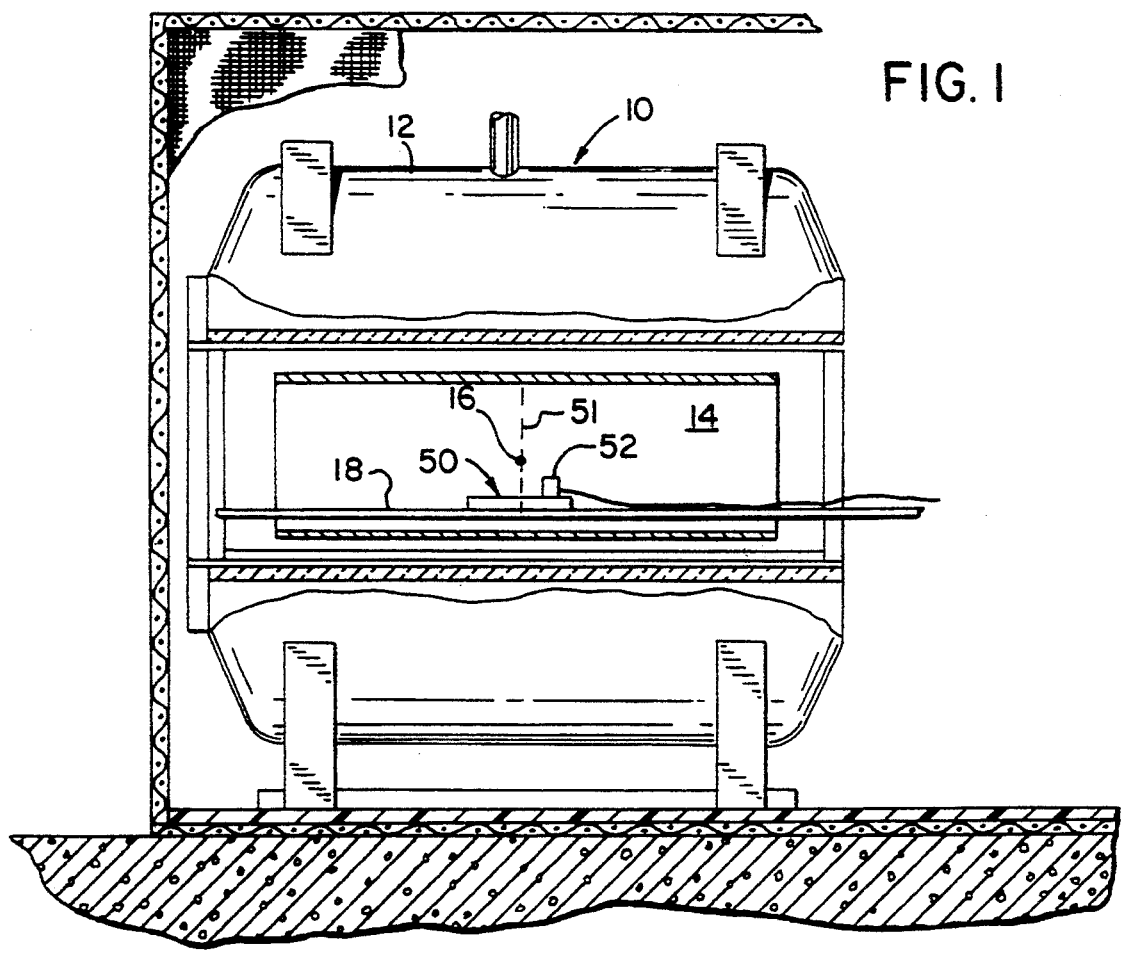
FIG. 1 is a partial cross-sectional view of electromagnet assembly for an NMR imaging system.

With initial reference to FIG. 1, an NMR imaging system 10 includes a magnet assembly 12 formed by a plurality of super conducting electromagnet coils enclosed in a conventional hollow cryostat chamber. The magnet assembly 12 has a generally cylindrical shape about a longitudinal axis that defines an interior volume 14 within which a human patient can be placed on table cradle 18 for imaging.

Figure 2:
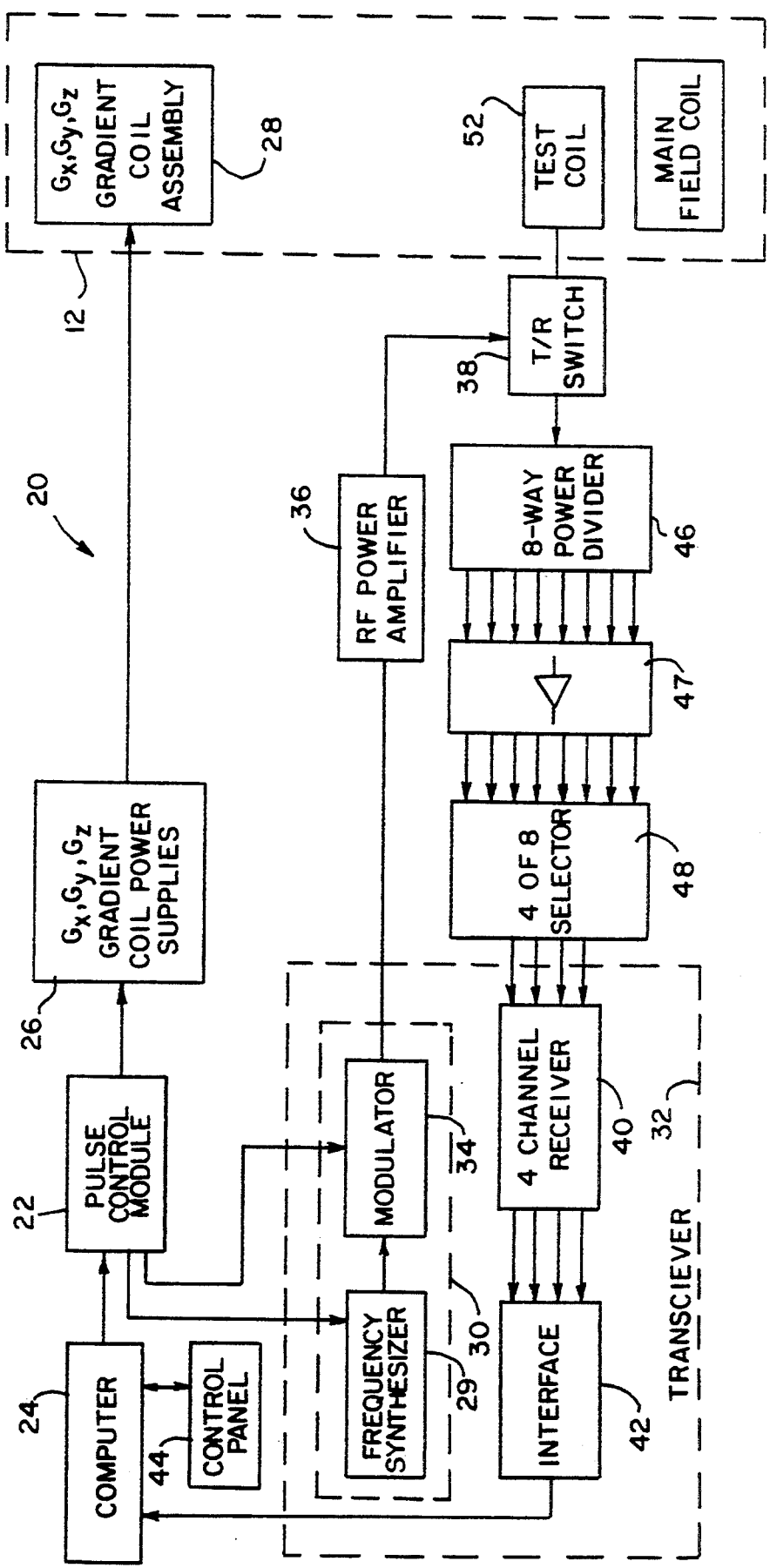
FIG. 2 is a circuit block diagram of an exemplary NMR imaging system incorporating a test apparatus according to the present invention.

FIG. 2 illustrates a control circuit 20 for the NMR imaging system 10 which has been configured for testing with the present apparatus. The control circuit 20 includes a pulse control module 22 which provides conventional, properly timed pulse sequences under the direction of a computer 24. The pulse control module 22, in turn, governs gradient power supplies 26 drive gradient coils 28 within assembly 12 to produce the magnetic field gradients Gx, Gy and Gz which are directed in mutually orthogonal X, Y and Z axis directions of a Cartesian coordinate system. An isocenter 16 of the Cartesian coordinate system exists in the interior volume 14 at which all three magnetic field gradients have zero magnitude. The pulse control module 22 also controls a radio frequency synthesizer 29 which is part of a transmitter 30 within a RF transceiver system, portions of which are enclosed by dashed line block 32. An RF modulator 34 receives the output of the synthesizer 29 and is controlled by the pulse control module 22. The RF signal from modulator 34 is amplified by a power amplifier 36 and applied to an input of a transmit/receive (T/R) switch 38.

During normal imaging operation, the transmit/receive switch 38 couples the RF excitation signal from the power amplifier 36 to an RF coil within the magnet assembly in order to excite the spinning of nuclei in the patient being imaged. After the excitation ceases, the relaxing nuclei in the patient emit magnetic resonance signals, which are picked up by the same RF coil and coupled by the transmit/receive switch 38 to a receiver 40. The receiver has four channels which can be utilized to detect signals from coil arrays, if desired. The digitized output from each channel of the receiver 40 is applied via an interface circuit 42 to computer 24 for processing to produce NMR images of the patient for display on control panel 44.

In order to calibrate or troubleshoot NMR imaging system 10, a special test fixture 50 is placed on table cradle 18 within the magnet assembly 12 as shown in FIG. 1. A transverse plane 51 in the interior volume 14 and passing through the isocenter 16 bisects the test fixture 50. The test fixture 50 has a test coil 52 which is connected to the transmit/receive switch 38 in place of the RF coil normally used for imaging. For test purposes, an eight-way power divider 46, eight-channel preamplifier 47 and a four-of-eight selector couple the transmit/receive switch 38 to the four input channels of receiver 40.

Figure 3:
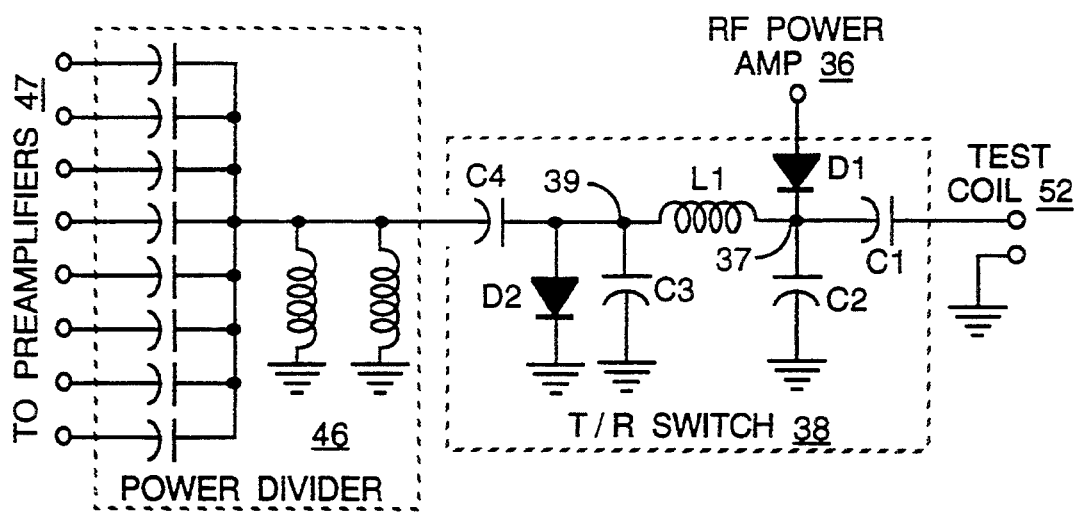
FIG. 3 is a schematic circuit diagram of the T/R switch and power divider in FIG. 2.

With reference to FIG. 3, the transmit/receive switch 38 has a PIN diode D1 which connects the output of the RF power amplifier 36 to node 37. A first capacitor C1 couples node 37 to the test coil 52 and a second capacitor C2 couples that node to ground. An inductor L1 is connected between nodes 37 and 39. A third capacitor C3 and another PIN diode D2 are in parallel between node 39 to ground, and an output capacitor C4 connects the power divider 46 to node 39. During the excitation period the RF power amplifier 36 also provides a bias current through PIN diodes D1 and D2 and inductor L1 which causes the diodes to become low impedances at the generated radio frequencies. The Pi network, formed by capacitors C2–C3 and inductor L1, behaves as a quarterwave transmission line. Thus, the short circuited PIN diode D2 produces a high impedance to the RF signal from the power amplifier 36 preventing the amplifier signal from reaching the power divider 46. As a result, the RF excitation signal passes through diode D1 and DC blocking capacitor C1 to the test coil 52. During the receive period, the bias current is removed and a negative bias voltage is applied by the RF power amplifier 36 to the T/R switch 38. This biases the PIN diodes D1 and D2 off producing high impedances. The NMR signal from the test coil 52 now passes to the power divider 46, which splits the NMR signal and applies equal portions to each channel of the receiver 40.

A vial 55 of a test substance, such as nickle chloride, is placed centrally within the test coil 52 during the test procedure. The NMR imaging system 10 then is operated to excite the molecules of the test substance and receive the NMR signals produced by the test substance at the given location within the interior volume 14. Since a pure sample of the test substance is placed within the test coil 52, the NMR signals produced should conform with a known response for that substance. The NMR signals are analyzed by computer 24 to determine whether the system performance is within acceptable tolerance levels. If the performance is unacceptable, the test results can be analyzed further to determine corrective measures.

Figure 4:
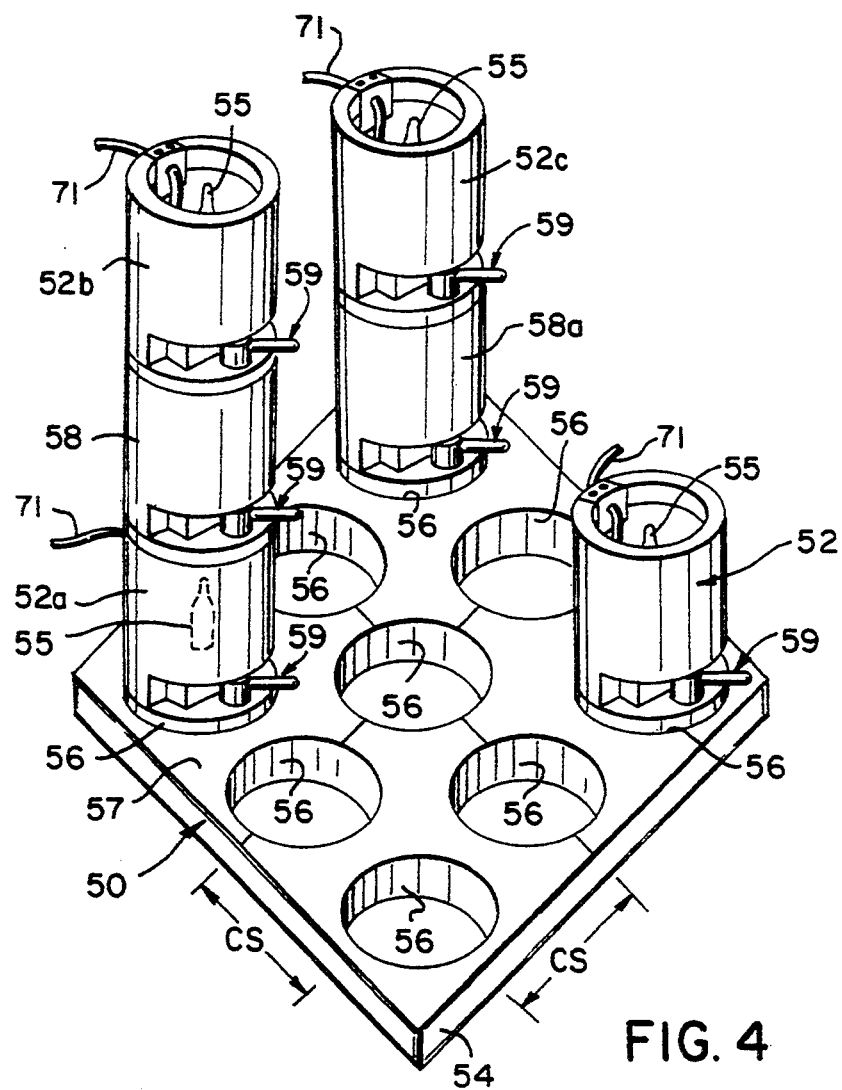
FIG. 4 is a isometric view of the test apparatus.

FIG. 4 illustrates the details of the test fixture 50, which includes a mounting plate 54 that is contoured to conform to the table cradle 18 and is provided with clamps (not shown) for fastening the plate to the table cradle 18. The mounting plate 54 has a square, flat upper surface 57 with nine apertures 56 positioned in a three by three array. The apertures 56 within the mounting plate 54 are sized to receive the bottom section of the test coil 52 and are positioned to accurately locate each test coil with respect to the isocenter 16 of the magnetic fields in the interior volume 14 when the test fixture 50 is centered on transverse plane 51 in FIG. 1. For example, the apertures 56 may be located with a center to center spacing CS of ten centimeters, see FIG. 4.

The test coil 52 can be positioned in any one of the apertures 56. In these positions, the center of the test coil 52 is a known distance (e.g. ten centimeters) below the isocenter 16. Alternatively, a spacer module 58 can be placed on top of a test coil 52a and a second test coil 52b is then placed on top of the spacer module as shown in FIG. 4. In this case the signals from the two coils are alternately used in the testing process. In a further variation, a spacer module 58a is placed directly into an aperture 56 in the mounting plate 54 and a test coil 52c is placed on top of that spacer module.

These variations in test coil placement, enable the center of the test coil 52' to be located at the same level as the isocenter 16 or a fixed distance (e.g. ten centimeters) above the isocenter. The nine apertures 56 and the use of spacer modules 58 to raise the test coil 52 allows the test coil to be positioned at a variety of locations in a three-dimensional space centered about the isocenter 16 of the magnetic fields within the interior volume 14. This enables the testing of the magnetic fields produced within assembly 12 to be performed in all octants with respect to their isocenter 16.

The test coils 52 and 52' and spacer modules 58 have a locking mechanism 59 to secure the respective component directly or indirectly to the mounting plate 54. The locking mechanism 59 not only insures accurate placement of the test coil, but prevents misalignment of the test coil as the table cradle 18 moves in and out of the magnet assembly 12 or due to vibration during the test experiment.

FIG. 5 illustrates the details of the test coil 52 in an exploded view. The test coil 52 has a circular, non-magnetic locator disk 60 having a diameter smaller than the diameter of the apertures 56 so that the locator disk will fit within an aperture. The locator disk 60 has a raised annular platform 62 within which an end of electromagnetic coil 64 fits. Coil 64 comprises a glass epoxy cylindrical form 66 fitted with a preformed inductor 68. The ends of the preformed inductor 68 are connected to a printed circuit board 70 to which one end of a coaxial cable 71 is electrically connected.

One end of a glass epoxy shield form 72 is placed around the platform 62 of the locator disk 60 and the coil 64. The shield form 72 has an opening 74 through which the ends of the preformed inductor 68 pass, and a copper shield 76 is bent around the outer surface of the shield form 72 with a small gap existing at the opening 74. The shield 76 is connected to circuit ground on the printed circuit board 70. A plastic cap 78 with a central aperture 79 therethrough is placed on top of the shield form 72 and fastened in place by two non-magnetic machine screws 80 which extend through the cap 78 and into threaded apertures in the locator disk 60. In the assembled test coil 52, the vial 55 containing the test substance is inserted through the aperture 79 and into a recess 81 in a raised receptor 83 on the locator disk 60. The printed circuit board 70 is attached by machine screws 82 to an edge of the cap 78 with a spacer 84 therebetween.

A housing 85 has a hollow cylindrical body 86 to which a disk shaped base 88 is fastened centrally across one end. The base 88 has a generally circular opening at its center to receive the shielded coil 64 and then the locator disk 60 is fastened to the outer surface of the base 88 by non-magnetic machine screws (not shown). The base 88 has another aperture 92 for the locking mechanism 59 which comprises a pin 94 which extends upwardly through that aperture 92. A cam 95 is formed at one end of pin 94 and a locking lever 98 is threaded into an aperture 96 at the other end of that pin. Although the pin 94 fits tightly within the aperture 92, it is able to rotate when force is applied to the locking lever 98.

The spacer modules 58 have a housing, similar to element 85, to which a locator disk is attached. The spacer modules do not include the coil 64 or other electrical components of the test coil 52 and do not hold a test substance.

When the test coil 52 is placed within an aperture 56 of the mounting plate 54, the pin 94 can be rotated with locking lever 98 so that its cam 95 engages the wall of the aperture 56 to secure the test coil 52. By rotating the locking lever 98 to retract the cam under the base 88, the test coil 52 may be removed from the aperture. When the test coil 52 is placed on top of a spacer module 58, the cam 95 engages the surface of an inner opening in the spacer module to secure the two components together.

The remote end of the body 86 from the base 88 has a longitudinally extending notch 100 which receives a cable clamp 102 that is fastened to the body 86. The cable clamp 82 holds a portion of the coaxial cable 71 which extends upwardly within the housing from the printed circuit board 70 to the cable clamp 102. The coaxial cable passes through the clamp 82 and extends outwardly therefrom until terminated by a conventional BNC male connector 104. The BNC connector 104 couples the cable to the transmit/receive switch 38.

Figure 6:
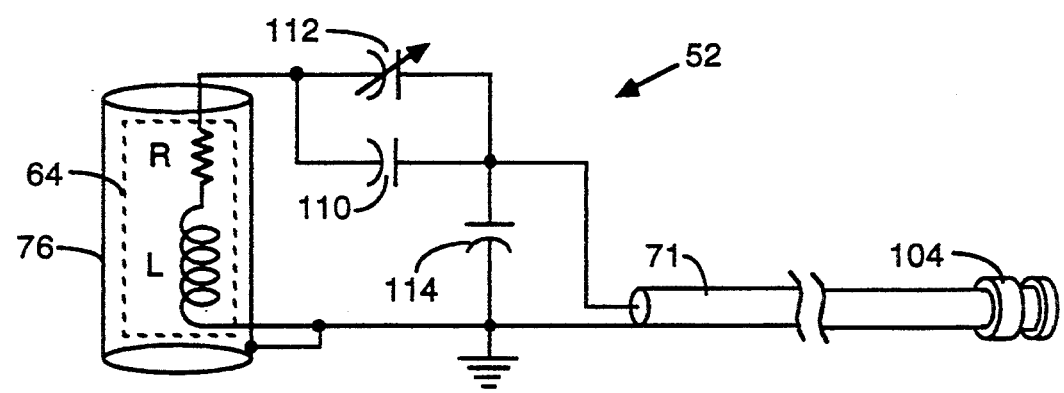
FIG. 6 is a schematic circuit diagram of the test coil assembly.

With reference to FIG. 6, the coil 64 is electrically represented by an inductance L and a resistance R in series. The coil 64 is connected to the printed circuit board 70 which contains a number of capacitors that couple the coil to the coaxial cable 71. Specifically, one end of the coil 64 is grounded by a connection to the shield of the coaxial cable 71, while the other end of the coil is connected by a capacitor 110 to the center conductor of the coaxial cable 71. A variable capacitor 112 is in parallel with capacitor 110 to adjust the impedance of the circuit and tune the test coil 52 for a minimum reflection coefficient at the desired Larmor frequency. Another fixed capacitor 114 is coupled between the center conductor and the shield of the coaxial cable.

This electric circuit for the test coil 52 has eliminated the separate series connected resistor found in previous test coils. The elimination of this resistor as well as the specific circuit increases the quality factor Q of the coil, thereby enhancing its sensitivity to the NMR signal and the signal to noise ratio. Although making the test coil 64 more sensitive by improving the quality factor would otherwise increase the interaction between the test coil 52 and components of the magnet assembly 12, the conductive shield 76 around the coil 64 reduces such interaction. Thus, the present test coil 52 has a high Q producing a much stronger output signal than in previous test coils.

Because of the increased strength of the signal from the test coil 52, the signal may be split by the eight-way divider 46 to drive each of the four input channels of the receiver 40. This enables a single NMR test procedure to provide data to every receiver channel, thereby enabling all four channels to be tested simultaneously. Previous low signal level test coils could only provide an input signal to one channel at a time, thereby requiring four separate NMR test sequences in order to evaluate the performance of all the receiver channels.

The invention being claimed is:

1. A test fixture for a magnetic resonance imaging system comprising:

a mounting plate for positioning within the magnetic resonance imaging system and having a plurality of apertures;

a test coil assembly including:
  (a) a housing having a section that can fit securely within any one of the plurality of apertures in said mounting plate, and having a receptor for holding a test substance,
  (b) a coil having a plurality of turns of a conductor and located with said housing, and
  (c) an electrically conductive shield extending substantially around said coil within said housing and connected to ground potential; and
a first spacer module having a opening for receiving the section of said housing and having a portion that can fit within any one of the plurality of apertures to hold said test coil a defined distance from said mounting plate.

2. The test fixture as recited in claim 1 wherein said housing further includes a locking mechanism for fixedly holding the section within one of the plurality of apertures in said mounting plate.

3. The test fixture as recited in claim 1 wherein said spacer module further includes a locking mechanism for fixedly holding the portion within one of the plurality of apertures in said mounting plate.

4. The test fixture as recited in claim 1 wherein housing includes an aperture adapted to receive one of the section of another housing and the portion of said spacer module.

5. The test fixture as recited in claim 1 further comprising a plurality of other spacer modules each one having an opening for receiving part of either said housing or another spacer module, and having a portion which can fit within any one of the plurality of apertures in said mounting plate and which can fit within an opening of another spacer module.

6. In a magnetic resonance imaging system having a magnet assembly for establishing orthogonal electromagnetic field gradients about an isocenter within the magnet assembly; a test fixture comprising:
a mounting plate for positioning at a reference location within the magnet assembly, and having a plurality of apertures;
a test coil assembly including:
  (a) a housing that can securely engage any one of the plurality of apertures in said mounting plate to hold said test coil assembly at a defined location with respect to the isocenter when said mounting plate is at the reference location, said housing having a receptor for a test substance,
  (b) a coil located with said housing and having a plurality of turns of an electrical conductor,
  (c) an electrically conductive shield extending substantially around said coil within said housing and connected to ground; and
a cylindrical spacer module for attachment to an end of said housing and having a portion for placement into one of the apertures in said mounting plate.

7. The test fixture as recited in claim 6 wherein:
said housing comprises a hollow cylindrical body with the receptor mounted across an end of the body;
said coil further comprises a hollow cylindrical form about which the electrical conductor is wound, with the form attached to said housing; and
said electrically conductive shield comprises a shield form attached to said housing, and an electrically conductive layer attached to a surface of the shield form.

8. The test fixture as recited in claim 6 wherein the receptor has an aperture that receives a vial containing the test substance.

9. The test fixture as recited in claim 6 wherein said housing further comprises a locking mechanism which engages said mounting plate.

10. The test fixture as recited in claim 1 further comprising a second spacer module having an opening for receiving part of either said housing or said first spacer module, and having a portion which can fit within any one of the plurality of apertures in said mounting plate and which can fit within the opening of said first spacer module.

* * * * *